United States Patent
Jabs et al.

(10) Patent No.: US 7,771,822 B2
(45) Date of Patent: Aug. 10, 2010

(54) CONDUCTIVE MATERIAL COMPRISING AN ME-DLC HARD MATERIAL COATING

(75) Inventors: Thomas Jabs, Meerbusch (DE);
Michael Scharf, Dietenheim (DE);
Martin Grischke, Liechtenstein (DE);
Orlaw Massler, Liechtenstein (DE)

(73) Assignees: Oerlikon Trading AG, Trubbach, Trubbach (CH); Wieland-Werke Ltd., Ulm (DE)

( * ) Notice: Subject to any disclaimer, the term of this patent is extended or adjusted under 35 U.S.C. 154(b) by 721 days.

(21) Appl. No.: 11/571,771

(22) PCT Filed: Jun. 15, 2005

(86) PCT No.: PCT/CH2005/000333

§ 371 (c)(1),
(2), (4) Date: Jan. 24, 2007

(87) PCT Pub. No.: WO2006/005200

PCT Pub. Date: Jan. 19, 2006

(65) Prior Publication Data

US 2008/0075625 A1    Mar. 27, 2008

(30) Foreign Application Priority Data

Jul. 9, 2004   (CH) .................................. 1166/04

(51) Int. Cl.
*B32B 9/00* (2006.01)
(52) U.S. Cl. .................. 428/408; 428/336; 428/469; 428/698; 428/699
(58) Field of Classification Search ............... 428/408, 428/469, 698, 699, 336
See application file for complete search history.

(56) References Cited

U.S. PATENT DOCUMENTS

| | | | | |
|---|---|---|---|---|
| 5,368,939 A | * | 11/1994 | Kawamura et al. | 428/408 |
| 6,087,025 A | * | 7/2000 | Dearnaley et al. | 428/623 |
| 6,110,329 A | * | 8/2000 | Holleck et al. | 204/192.15 |
| 6,180,263 B1 | * | 1/2001 | Naoi | 428/634 |
| 6,284,376 B1 | | 9/2001 | Takenouchi et al. | |
| 6,340,245 B1 | * | 1/2002 | Horton et al. | 428/216 |
| 6,372,303 B1 | * | 4/2002 | Burger et al. | 427/577 |
| 6,478,843 B1 | * | 11/2002 | Wittdorf et al. | 428/408 |
| 6,726,993 B2 | * | 4/2004 | Teer et al. | 428/469 |
| 6,740,393 B1 | * | 5/2004 | Massler et al. | 428/408 |
| 7,073,390 B2 | * | 7/2006 | Luthje et al. | 73/777 |
| 2003/0235006 A1 | * | 12/2003 | Ameen et al. | 360/99.08 |

FOREIGN PATENT DOCUMENTS

| | | |
|---|---|---|
| DE | 19922161 A1 | 12/1999 |
| FR | 2592063 A1 | 6/1987 |
| JP | 10-228828 A | 8/1998 |

OTHER PUBLICATIONS

Patent Abstracts of Japan, vol. 1998, No. 14, Dec. 31, 1998 & JP 10 241479 A (Furukawa Electric Co Ltd:THE), Sep. 11, 1998 abstract.
International Search Report for international application PCT/CH2005/000333, dated Jan. 9, 2005.
Database WPI, Section CH, Week 198740, Derwent Publications Ltd., London, GB; Class L03, AN 1987-281129; XP002290741 & JP 62 195815 A (Nippon Oil Seal Ind Co. Ltd.) Aug. 28, 1987 abstract.

* cited by examiner

*Primary Examiner*—Archene Turner
(74) *Attorney, Agent, or Firm*—Pearne & Gordon LLP

(57) ABSTRACT

The invention relates to a conductive material consisting of an alloy that contains copper, for use as a plug-in or clip connection. Said material comprises a cover layer that is deposited on at least some sections of the contact surface, said layer consisting at least of a support layer and an adhesive layer. The anti-friction layer has a carbon content greater or less than 40 and less than or equal to 70 atomic percent.

21 Claims, No Drawings

CONDUCTIVE MATERIAL COMPRISING AN ME-DLC HARD MATERIAL COATING

TECHNOLOGICAL FIELD

The invention relates to a conductive cupriferous-alloy material for use in plug or clamp connectors as conceptually specified in claim 1. It further relates to a contact component according to claim 18 as well as to a subassembly according to claim 19 and a strip or profile element according to claim 20.

PRIOR ART

The conductivity of cupriferous materials has been known from prior art, as has the suitability of copper-containing materials for the application of electroplated layers for surface treatment. By contrast, PVD, CVD or PVD/CVD coatings have so far been rarely used on the relatively soft cupriferous materials in view of the fact that, for instance when exposed to substantial sliding friction as may occur in the assembly of plug or clamp connectors, the coating is pushed into the base material or it breaks, while many of the layer systems used in the coating of tools have too high a coefficient of friction (for example, the coefficient of friction of the WC or $Cr_xC_y$ carbides is about 0.5 and even higher), too high a roughness factor or too little conductivity, thus making them fairly unsuitable for an application of this type.

DE 1 802 932 describes a high-frequency plasma process for the coating of electrical contacts with carbide-based antiwear layers. DE 3011694 covers a similar method which also includes the application of an electroplated bonding layer on various hardened or tempered metallic materials with subsequent PVD coating in a high-frequency plasma, which process also includes the deposition of a hard-material i.e. carbide layer. While this provides good electrical conductivity and enhanced wear resistance, the carbide coating results in a relatively high coefficient of friction.

DE 4421144 describes coated tools whose product life is extended by the deposition of a hard-material layer consisting of a metal carbide, followed by the application of a friction-reducing, free carbon-containing tungsten carbide-based layer.

DESCRIPTION OF THE INVENTION

It is the objective of this present invention to introduce a cupriferous conductive material that avoids the drawbacks inherent in prior art while offering better electrical properties as well as improved product-life and antifriction performance compared to materials with conventional coatings.

That objective is achieved with the inventive features specified in the characterizing clause of claim 1.

By applying carbon-containing antifriction and hard-material layers, modified according to the invention to have a carbon content greater than or equal to 40% but with an atomic percentage of less than or equal to 70 and deposited on copper metal or copper alloys, it is now possible to enhance the surface hardness and thus the wear and abrasion resistance of the material without significantly changing its excellent electrical properties. The definition of carbon content refers to the concentration of carbidically bound and free carbon which, together with the carbide builder and selected additional elements, adds up to 100%. In the process, by a method described in more detail further below, a hard-material layer is deposited that has defined tribological and electrical properties and results in an extended life of the conductive material concerned. These layers will be slightly less hard than conventional—for instance carbide—layers but significantly harder than the base layer which they protect against abrasive wear. Surprisingly, these layers offer better protection of the base material in the case of plug and clamp connectors than do conventional hard layer systems, although for applications involving high surface pressures a support layer may still be added. In the case of these hard-material coatings this phenomenon may also be attributable to the relatively low coefficient of friction, an advantage for instance for plug connectors since it requires less insertion force, which in turn prevents the scratching of the possibly uncoated matching socket.

It is these very properties that make such coatings suitable for application in vehicle or aircraft engineering as well, i.e. especially for application on components exposed to continuous vibration, oscillation or the like, perhaps even in combination with concussive impact. Their greater stability compared to conventional copper-based conductive materials prevents operationally compromising or even inhibiting surface fatigue to which such connecting elements are susceptible due to the relatively limited hardness of the copper or the traditionally coated copper materials. Moreover, tribo-oxidative changes that occur at elevated operating temperatures and often cause such plug and clamp connectors to fail can be effectively prevented.

So far, a very significantly improved load resistance has been exhibited by plug and clamp connectors consisting of the following cupriferous alloys coated in accordance with this invention: copper, bronze, brass or German silver. Similar improvements, however, can be expected with other base materials as well, such as CuBe and other alloys, or in other applications.

It may also be advantageous to use pre-electroplated conductive materials. Examples thereof include Cr, Ni or CrNi layers that are deposited before the support layer is applied.

In view of the low precipitation temperatures involved, plasma CVD, PVD or PVD/CVD hybrid techniques lend themselves particularly well to the deposition of Me-DLC layers for the coating for instance of heat-treatable copper metals.

But then, it was not possible with conventional coatings such as the free-carbon containing layers described in DE 4421144 or the DLC (diamond-like carbon) layers described in U.S. Pat. No. 4,992,153 or DE 10018143 to obtain adequate conductivity and, in the case of conventional carbide layers, to adequately prevent the latter from denting the base material as mentioned above. Surprisingly, it was only by selecting a carbon content greater than or equal to 40% but with an atomic percentage smaller than or equal to 70 that a significant conductivity improvement could be achieved. Particularly good results were obtained with a carbon content greater than or equal to 50 but with an atomic percentage smaller than or equal to 60.

Applying an additional support backing i.e. layer comprising at least one metal Me from among the subgroups IV, V and VI of the periodic system of elements (i.e. Ti, Zr, Hf; V, Nb, Ta; Cr, Mo, W) or aluminum or Si, prevented any denting even under very high pressure. It was also found to be particularly desirable to use support layers which, in addition to the metal component, also contained a nonmetallic element such as C, N, B or O, or hard-material compounds composed of the metals and nonmetals mentioned. As an example only, such support layer systems may consist of TiN or Ti/TiN (meaning a metallic titanium layer with an adjoining titanium nitride hard layer), or of CrN or Cr/CrN, $Cr_xC_y$ or $Cr/Cr_xC_y$, $Cr_x(CN)_y$, TiAl or TiAlN and TiAl/TiAlN.

Depending on the intended application it is important for the support layer to meet a minimum thickness requirement which is a function primarily of the surface pressure in each particular case. For example, in cases of minor surface pressures a DLC layer 0.5 µm thick provided adequate support, whereas a backing only 0.3 µm thick did not offer sufficient support. In general, however, a layer thickness of at least 1 to about 3 µm is recommended. For applications involving particularly high surface pressures it may be desirable to use layers of a greater thickness, for instance 6 µm.

In addition, it is possible to interposition between the support layer and the antifriction layer a metallic intermediate layer with or without a gradual transition, or a direct junction in the form of a graded index layer with a carbon content progressively increasing in the direction of the antifriction layer.

Desirably, therefore, the DLC antifriction layer is constructed as follows: Deposited directly on the support layer is a metallic intermediate layer consisting of at least one metal Me of the elements of the IV, V or VI subgroup, Al or Si. The intermediate layer preferably consists of Cr or Ti, elements that have been found to lend themselves particularly well to this effect. It is equally possible, however, to use nitridic, carbidic, boridic or oxidic intermediate layers, or intermediate layers composed of one or several metals in combination with one or several of the above-mentioned nonmetals which, if necessary, may themselves be built up on a metallic base layer with or without a gradual transition. That intermediate step can be omitted if the carbon antifriction layer is applied directly on the bonding layer and the bonding layer consists of a metal or of a compound suitable for use as a bonding layer.

Preferably following that, or directly in its place without an intermediate layer, is a transitional layer especially in the form of a graded index layer over the course of which, perpendicular to the surface of the work piece, the metal content decreases and the carbon content increases. The carbon increase may be obtained by the addition of perhaps different carbidic phases or of free carbon or of a mixture of such phases with the metallic phase of the intermediate layer. As those skilled in the art know, the thickness of the graded index layer can be selected by setting appropriate process ramps. The increase in the C-content and decrease in the metallic phase may be continuous or stepwise, and at least in part of the graded-index layer a series of high-metal and high-C layers may be provided to progressively reduce laminar stress. As an example, the initial layer may be an MeC layer deposited for instance by sputtering, with the free-carbon proportion increased either continually or in steps by the injection of a carbon-containing reactive gas. For tungsten carbide-based layers, as an example, a ratio of about 50:1 to 2:1 between the carbidically bound and the free carbon has been found to work very well. Similar relationships have been established for chromium carbide-, tantalum carbide- and molybdenum carbide-based layers.

In essentially continuous fashion the above-mentioned configuration of the graded-index layer causes the respective characteristics of the material (e.g. E-module, structure etc.) of the support layer and the DLC layer to be mutually adapted, thus helping to minimize the risk of fissuring otherwise encountered along the metal i.e. Si/DLC interface.

The DLC antifriction layer process can be terminated by turning off the sputter and/or bias upon reaching a defined flow of the carbon-containing process gas or upon reaching a particular pressure level. Alternatively, the coating parameters can be held constant during the final process phase in order to maintain the properties of the outer functional layer constant above a desired minimum layer thickness.

The hardness of the entire carbon layer is selected at a value greater than 0.8 GPa, preferably greater than or equal to 10 GPa, where even at a layer thickness of >1 µm and preferably >2 µm on a steel test sample with a hardness of about 60 HRC a bonding strength of better than or equal to HF 3 but preferably equal to HF 1 per VDI 3824 page 4 is attained. Measurements of the contact resistance of DLC layers according to the invention have resulted in values of between $\delta=0.1$ mΩ and $\delta=90$ mΩ, the selected values preferably being between 0.5 mΩ and 10 mΩ since, on the one hand, $\delta$-values smaller than 0.5 mΩ are attainable only with the addition of precious metals, substantially increasing the cost of manufacture, while on the other hand a contact resistance of more than 10 mΩ is already too high for certain applications.

At the same time, the object carbon layer offers the desirable feature of a low coefficient of friction as is typical for Me-carbon, preferably at $\mu \leqq 0.2$ in the pin-on-disk test at a layer roughness level of $R_a=0.01\text{-}0.04$; $R_z$ DIN<0.8 and preferably <0.5.

The growth rate is about 1-3 µm/h and depends, apart from the process parameters, on the load and the holding device. Major factors in this case depend on whether the parts to be coated are mounted on single-, double- or triple-rotating holders, on magnetic holders, on clamps or on plug-in retainers. Similarly important is the overall mass and the plasma permeability of the holders. For example, lightweight holders such as spoke or spider plates rather than solid plates produce higher growth rates and in general a better overall layer quality. The laminar stress may be around 0.8 GPa and thus within the usual range for hard DLC layers. Moreover, at a slightly lower hardness (9 to 15 GPa), layers of this type exhibit a distinctly lower coefficient of friction, reducing the insertion force involved.

These properties can be further improved and/or stabilized against corrosion/oxidation by the addition—through Co sputtering or evaporation, alloying into the target materials, or similar techniques—of small amounts of the elements Ag, Au, Cu, Fe, Ir, Mo, Ni, Pd, Pt, Os, Rh, Ru, W and/or alloys thereof. If particularly high conductivity is needed, it will be desirable to provide the final layer package with a residual metal content at a minimum of 30 and a maximum of 60% but preferably between 40 and 50%.

In view of the excellent mechanical properties of these metal-containing DLC layers, they also lend themselves well to applications where the coated conductive material is to additionally serve a bearing function. For example, these conductive materials can be advantageously used for bearings that double as conductors of electrical signals.

EXAMPLES AND TESTS PERFORMED

The following will describe the invention with the aid of various implementation examples. All Me-DLC layers and support layers were precipitated at temperatures below 250° C. and deposited on copper-based materials in a Balzers BAI 830 C production system, a modified version as discussed in DE 100 18 143 under FIG. 1 and related description [0076] to [0085]. All coatings were first pretreated in a heating and etching procedure, utilizing a low voltage arc, as described in process example #1 of that document. The correspondingly identified sections of that preliminary patent disclosure are hereby made an integral part of this present patent application.

Comparative Example #1

In the terminating i.e. outer layer region a metalliferous DLC antifriction layer was applied on a CuSn8 bronze substrate via a chromium bonding layer but without the addition of a support layer. First, following the above-mentioned pretreatment, the chromium bonding layer was deposited as described in the process example #1 of DE 100 18 143.

Next, with the Cr targets activated, six WC targets were activated applying power at a rate of 1 kW each and both target types were simultaneously run for 2 minutes. In the process, with the Ar flow kept constant, the power of the WC targets was increased over 2 minutes from 1 kW to 3.5 kW. At the same time the negative substrate voltage on the components was increased, ramp-style over 2 minutes, from 0 V at the end of the Cr bonding layer to 300 V. The 300 V was thus reached when the WC targets were running at maximum power. The Cr targets were then turned off. The WC targets were allowed to run for 6 minutes at a constant Ar flow and a power output of 3.5 kW after which, over 11 minutes, the acetylene gas flow was increased to 200 sccm and held constant for 60 minutes at the parameters described in Table 1). After that the coating process was ended.

TABLE 1

| Coating parameter #1 - metal-containing DLC layer | |
|---|---|
| Argon flow | 115 sccm |
| Acetylene flow | 200 sccm |
| Bias voltage | −300 V |
| Coil voltage, upper coil | 6 A |
| Coil voltage, lower coil | 0 A |
| Target power | 6 × 3.5 kW |

Example #2

This differed from Example #1 in that during the last process phase the acetylene gas flow was increased over 5 minutes to only 80 sccm where it was held constant for 60 minutes.

Example #3

This differed from Example #1 in that during the last process phase the acetylene gas flow was increased over 2 minutes to 30 sccm where it was held constant for 60 minutes.

Comparative Example #4

This differed from Example #1 in that during the last process phase no acetylene was added and, after the Cr targets had been turned off, the WC targets were run for 60 minutes at a constant Ar flow.

Example #5

For Example #5 the first step was to deposit a CrN support layer whereupon, analogous to Example #3, a conductive Me-DLC layer was applied on the support layer. The CrN support layer was deposited in accordance with the parameters specified in Table 5), with the plasma density additionally augmented by a low voltage arc discharge ignited and operated in the central axis between a hot cathode and an auxiliary anode.

TABLE 5

| CrN support layer coating parameters | |
|---|---|
| Argon flow | 100 sccm |
| Nitrogen flow | 100 sccm |
| Arc current | 75 A |
| Bias voltage | −100 V |
| Coil voltage, upper coil | 6 A |
| Coil voltage, lower coil | 0 A |
| Target power | 2 × 8 kW |

Example #6

For Example #6, the first step was to apply a chromium bonding layer as in Example #1. The adjoining WC-containing functional layer was doped with Ag.

With the Cr targets activated, four WC targets were activated with a power of 1 kW each and both target types were allowed to simultaneously run for 2 minutes, while over 2 minutes, with the Ar flow kept constant, the power of the WC targets was increased from 1 kW to 3.5 kW.

Two silver targets that were also mounted in the coating system were ignited at the same time as the WC targets and during the same time span their power was increased from 0 to 1 kW. Concurrently, the negative substrate voltage on the components was increased, ramp-style over 2 minutes, from 0 V at the end of the Cr bonding layer to 300 V. The Cr targets were then turned off. The WC and Ag targets were jointly run for 6 minutes under a constant Ar flow whereupon, over 2 minutes, the acetylene gas flow was increased to 30 sccm, and during the final coating phase the parameters listed in Table 6) were held constant for 60 minutes.

TABLE 6

| Metal-containing coating parameters | |
|---|---|
| Argon flow | 115 sccm |
| Acetylene flow | 30 sccm |
| Bias voltage | −300 V |
| Coil voltage, upper coil | 6 A |
| Coil voltage, lower coil | 0 A |
| WC target power | 4 × 3.5 kW |
| Ag target power | 2 × 1 kW |

Assessment of the Layers

As will be evident from Table 7), prior-art coatings as described in Comparative Examples #1 and #4 exhibit relatively high contact resistance. Example #1 is typical of an a-C:H:Me or Me-DLC layer, with a C-component rapidly increasing toward the surface. Example #4 illustrates a carbide layer without noteworthy free-carbon constituents.

The measured values, representing averages from 5 different measuring points, were in each case acquired 10 seconds after the placement of a 100 g contact weight. The tip of the contact weight consisted of gold with a 3 mm diameter. The individual value determined was verified by a preceding and a subsequent reference measurement on gold.

The abrasive force of the plug connectors was determined on a macro abrasion test station for

|  | DLC connectors | Standard connectors (tin-plated) |
| --- | --- | --- |
| Sample geometry | rider on flat | rider on flat |
| Rider diameter | 4 mm | 4 mm |
| Contact surface | 0.3 mm² | 0.3 mm² |
| Test atmosphere | dry | dry |
| Frequency | 1 cycle in 2.5 sec | 1 cycle in 2.5 sec |
| Test duration | 3000 cycles | 25 cycles |
| Normal force | 20 N | 5 N |
| Path length of friction | 3 mm | 3 mm |

Determining the abrasive force after a defined number of cycles reveals the abrasive wear of the sample. After 25 cycles the tin-plated standard connector showed an abrasive force of 1000 mN. Increasing the number of cycles would lead to complete destruction. The values for DLC-coated connectors are shown in the third column.

Surprisingly, the tests revealed that coatings with a free-carbon content in an intermediate range (Examples #2 and #3) exhibit markedly lower contact resistance. That low contact resistance remained unaffected even after a CrN support layer was added as indicated in Example #5. Co sputtering of Ag as described in Example #6 reduced the contact resistance even further.

TABLE 7

Contact resistance and abrasive force of different DLC coatings.

| Example # | C2H2 Flow [SCCM] | C-Content [%] | Contact Resistance [mΩ] | Abrasive Force [mN] |
| --- | --- | --- | --- | --- |
| 1 | 200 | 75 | 25 | 900 |
| 2 | 20 | 60 | 25 | 900 |
| 3 | 30 | 54 | 2 | 1000 |
| 4 | 0 | 50 | 20 | 1500 |
| 5 | 30 | 54 | 2 | 900-1000 |
| 6 | 30 | 54 | 1 | — |

The invention claimed is:

1. Conductive material of a cupriferous alloy for use in plug or clamp connectors, with a coating deposited at least one parts of its contact surface, said contact layer consisting of at least one bonding layer and one carbon-containing antifriction layer, with a support layer which is provided between the bonding layer and the antifriction layer, or that the bonding layer serves as the support layer characterized in that the antifriction layer has a carbon content greater than or equal to 40% with an atomic percentage smaller than or equal to 70 and that the bonding layer and/or the support layer contains small amounts of one or several of the following elements and/or their alloys: Ag, Au, Cu, Fe, Ir, Mo, Ni, Pd, Pt, Os, Rh, Ru, W and that the contact resistance is between 0.1 and 90 mΩ.

2. Conductive material as in claim 1, characterized in that the antifriction layer is a hard-material layer containing diamond-like carbon.

3. Conductive material as in claim 1, characterized in that the antifriction layer additionally contains at least one metal Me from among the elements of subgroup IV, V and VI of the periodic system of elements (i.e. Ti, Zr, Hf; V, Nb, Ta; Cr, Mo, W) and Si.

4. Conductive material as in claim 3, characterized in that the antifriction layer contains a metal-carbide layer deposited thereon, and the metal-carbide layer has a free-carbon content that increases toward the surface.

5. Conductive material as in claim 4, characterized in that the metal carbide is a carbide of the subgroup IV, V and VI of the periodic system of elements.

6. Conductive material as in claim 5, characterized in that the support layer contains at least one metal Me from among the elements of the subgroup IV, V and VI of the periodic system of elements (i.e. Ti, Zr, Hf; V, Nb, Ta; Cr, Mo, W) and Al or Si.

7. Conductive material as in claim 5, characterized in that the support layer additionally or exclusively comprises one or several hard-material compounds containing at least one metal Me and at least one nonmetal, said metal consisting of at least one of the elements of subgroup IV, V and VI of the periodic system of elements (i.e. Ti, Zr, Hf; V, Nb, Ta; Cr, Mo, W) and Al or Si and said nonmetal containing at least one of the elements C, N, B or O.

8. Conductive material as in claim 5, characterized in that a transitional layer is provided between the support layer and the antifriction layer.

9. Conductive material as in claim 8, characterized in that the transitional layer consists of at least one metal Me from among the elements of the subgroup IV, V and VI of the periodic system of elements (i.e. Ti, Zr, Hf; V, Nb, Ta; Cr, Mo, W) and Al or Si.

10. Conductive material as in claim 8, characterized in that the transitional layer is a graded index layer whereby the C-content of the transitional layer increases in the direction of the antifriction layer.

11. Conductive material as in one of the claims 6 to 10, characterized in that the thickness of the support layer is between 0.5 and 6 μm.

12. Conductive material as in claim 11, characterized in that the thickness of the support layer is between 1 and 3 μm.

13. Conductive material as in claim 5, characterized in that the metal carbide is a carbide of tantalum, molybdenum, chromium or tungsten carbide.

14. Conductive material as in claim 7, characterized in that said nonmetal contains carbon.

15. Conductive material as in claim 1, characterized in that the contact resistance is between 0.5 and 10 mΩ.

16. Conductive material as in claim 1, characterized in that the cupriferous alloy consists of copper, bronze, brass or German silver.

17. Conductive material as in claim 1, characterized in that the cupriferous alloy is pre-coated with an electroplated layer.

18. Conductive material as in claim 1, characterized in that the cupriferous alloy is pre-coated with an electroplated layer consisting of a Cr, a Ni or a CrNi alloy.

19. Electrical contact component containing or consisting of a conductive material according to claim 1.

20. Electrically conductive subassembly comprising at least one contact component according to claim 19.

21. Electrically conductive strip or profile incorporating at least one contact component according to claim 20.

* * * * *